US008228221B2

(12) United States Patent
Lai et al.

(10) Patent No.: US 8,228,221 B2
(45) Date of Patent: Jul. 24, 2012

(54) METHOD AND APPARATUS FOR CALIBRATING SIGMA-DELTA MODULATOR (75) Inventors: Fang-Shi Jordan Lai, Chia Yi (TW); Hsu-Feng Hsueh, Tainan (TW); Cheng Yen Weng, Hsinchu (TW); Yung-Fu Lin, Hsinchu (TW); Manoj M. Mhala, Hsinchu (TW); Tao Wen Chung, Zhubei (TW); Chin-Hao Chang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 116 days.

(21) Appl. No.: 12/891,952

(22) Filed: Sep. 28, 2010

(65) Prior Publication Data
US 2012/0075132 A1   Mar. 29, 2012

(51) Int. Cl.
*H03M 3/02* (2006.01)
(52) U.S. Cl. ........................................ 341/143; 341/118
(58) Field of Classification Search .................. 341/118, 341/120, 143
See application file for complete search history.

(56) References Cited

U.S. PATENT DOCUMENTS

| 5,959,562 A * | 9/1999 | Wiesbauer ..................... 341/143 |
| 6,151,613 A | 11/2000 | Khoini-Poorfard |
| 6,556,158 B2 * | 4/2003 | Steensgaard-Madsen .... 341/131 |
| 7,279,990 B2 | 10/2007 | Hasegawa |
| 8,134,486 B2 * | 3/2012 | Lai et al. ........................ 341/120 |
| 2005/0275572 A1 * | 12/2005 | Bjornsen ........................ 341/120 |

OTHER PUBLICATIONS

Zhang, Z., An Abstract of the Dissertation entitled "A Dual-Path 2-0 MASH ADC with Dual Digital Error Correction", Nov. 27, 2006, 93 pages.
Zhang, Z. et al., "A 14-bit dual-path 2-0 MASH ACD with dual digital error correction", Analog Integr. Circ. Sig. Process, 2009, 59:143-150.

* cited by examiner

*Primary Examiner* — Howard Williams
(74) *Attorney, Agent, or Firm* — Duane Morris LLP (57) ABSTRACT In a method of converting an analog signal to digital format, an analog input signal is received and processed using sigma-delta modulation to provide a first digital signal that represents the analog input signal in digital format and to provide a second digital signal that represents a first error introduced during the sigma-delta modulation. A second error that is error introduced during the sigma-delta modulation is estimated. A pre-correction signal is determined based on the first and second digital signals. A difference between the estimated second error and the pre-correction digital signal is determined to provide a digital output signal representing the analog input signal in digital format. An error correction element operable to adjust the digital output signal based on the analog input signal, the digital output signal, and the second digital signal is controlled.

20 Claims, 6 Drawing Sheets

METHOD AND APPARATUS FOR CALIBRATING SIGMA-DELTA MODULATOR

BACKGROUND

Figure 1:
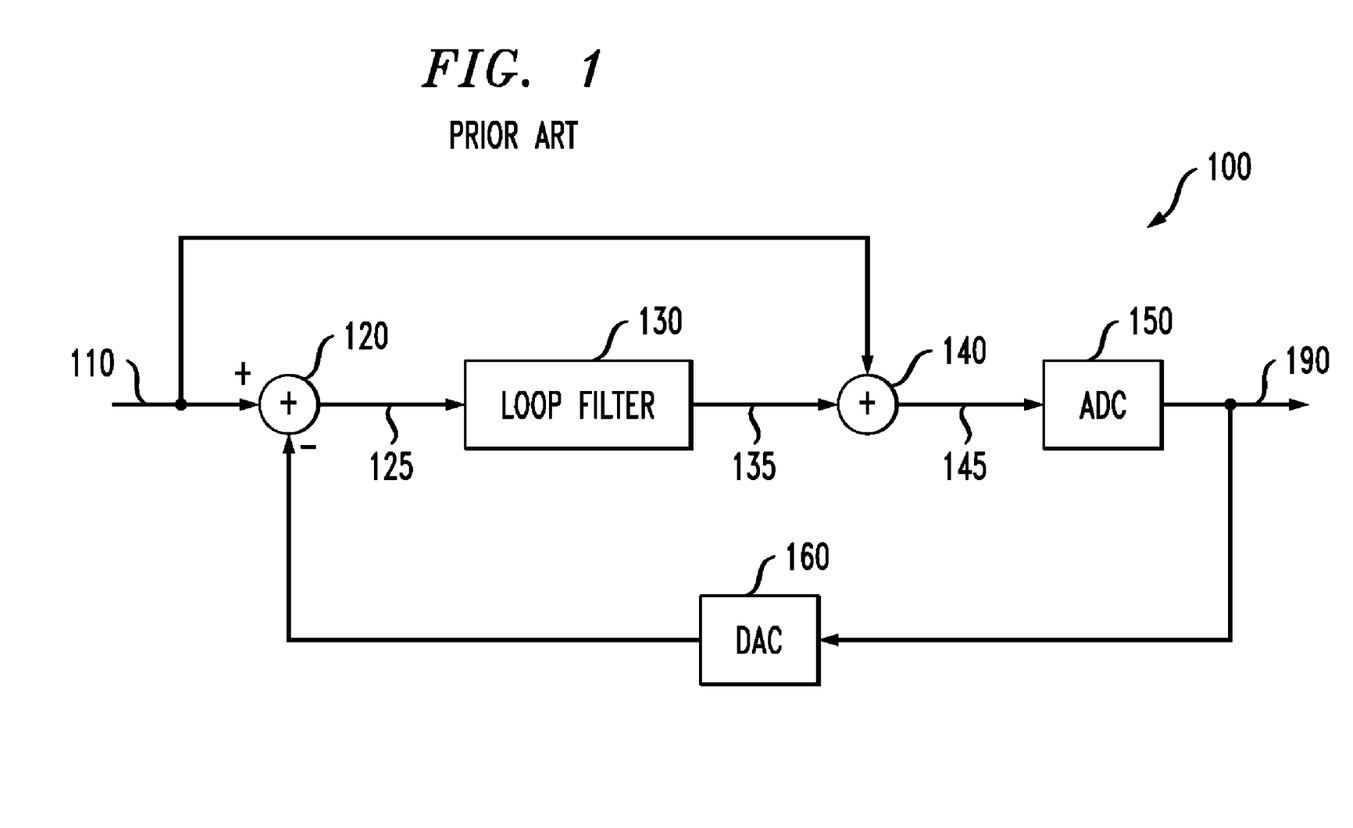
FIG. 1 is a block diagram of a known sigma-delta modulator in a feed-forward configuration.

Sigma-delta modulators (SDMs) are devices that may be used in analog-to-digital converters. SDMs may also be referred to as delta-sigma modulators (DSMs). SDMs may use pulse-density modulation to convert an analog input signal to a digital pulse train whose spacing contains information representative of the analog input signal. SDMs are described at, e.g., U.S. Pat. No. 7,279,990 by Hasegawa, which is hereby incorporated by reference herein in its entirety. Sigma-delta modulation may be used in phase-locked loops (PLLs), e.g., for generating a modulation signal that modulates a frequency division ratio of a comparator or frequency divider of a PLL circuit. A variety of SDM structures are known. FIG. 1 shows a known SDM circuit 100 that is referred to as a feed-forward SDM structure. An analog input signal 110 is provided to a subtractor 120 that provides an output 125 to a loop filter 130, which may be an integrator. An output 135 of the loop filter 130 is added to the analog input signal 110, and the resulting output 145 is quantized by an analog-to-digital converter (ADC) 150. The resulting digital signal 190 is fed back via a digital-to-analog converter (DAC) 160 to the subtractor 120.

Noise leakage is a challenge facing circuit designers employing SDM techniques. Quantization noise associated with ADC 150 and error associated with DAC 160 are factors that degrade overall system performance. It is desirable to address such errors and noise efficiently.

SUMMARY

In some embodiments, a multi-stage noise-shaping (MASH) analog to digital converter (ADC) comprises a sigma-delta modulator (SDM) circuit, an error correction module, and a calibration circuit. The SDM circuit is configured to convert an analog input signal to a first digital signal representing the analog input signal in digital format, and to provide a second digital signal representing a first error of the SDM circuit. The error correction module is configured to estimate a second error introduced by the SDM circuit based on the first digital signal, and to provide a digital output signal representing the analog input signal in digital format. The calibration circuit is configured to update the digital output signal based on the analog input signal, the digital output signal, and the second digital signal.

In some embodiments, an analog input signal is received. The analog input signal is processed using sigma-delta modulation to provide a first digital signal that represents the analog input signal in digital format and to provide a second digital signal that represents a first error introduced during the sigma-delta modulation. A second error introduced during the sigma-delta modulation is estimated. A pre-correction signal is determined based on the first and second digital signals. The pre-correction digital signal is corrected based on stored thermometer codes and error estimates to provide a digital output signal representing the analog input signal in digital format. In this context, a "thermometer" code is a base one numerical code wherein a variable number of ones represents a value between zero and a maximum number. An error correction element is controlled. The error correction element is operable to adjust the digital output signal based on the analog input signal, the digital output signal, and the second digital signal.

In some embodiments, a calibration circuit comprises an analog to digital converter (ADC), a subtractor, a correction module, and a filter. The ADC is configured to quantize an analog input signal. The subtractor is configured to compute a difference between the quantized analog input signal and a digital output signal representing the analog input signal in digital format The correction module is configured to correct an output of the subtractor. The filter is configured to receive an output of the correction module and an error of a sigma-delta modulator, and to provide a calibration signal operable to adjust the digital output signal.

The construction and method of operation of various embodiments, however, together with additional advantages thereof will be best understood from the following descriptions of specific embodiments when read in connection with the accompanying figures.

BRIEF DESCRIPTION OF THE DRAWINGS

The following will be apparent from elements of the figures, which are provided for illustrative purposes and are not necessarily to scale.

DETAILED DESCRIPTION

Figure 2:
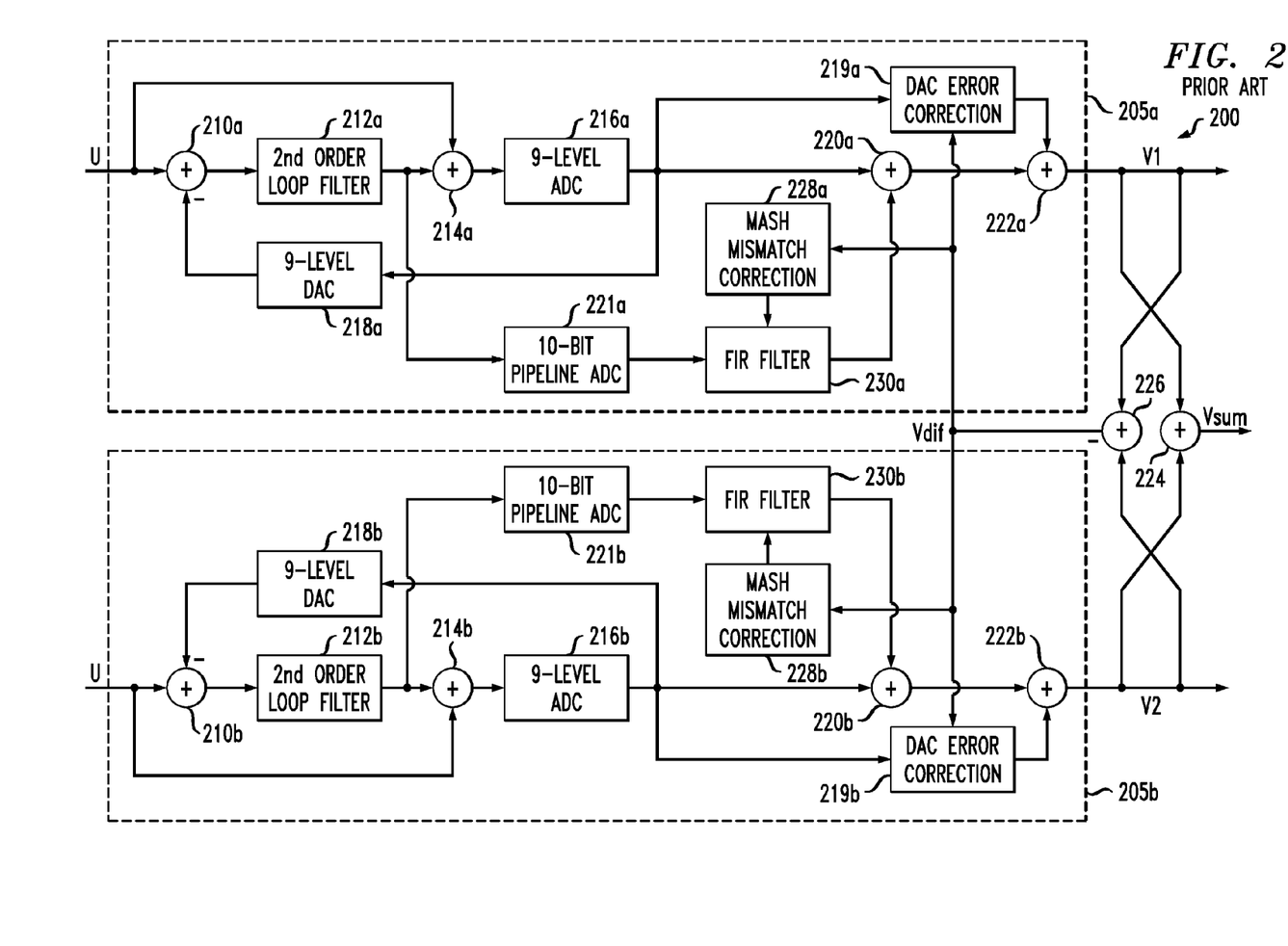
FIG. 2 is a block diagram of a known analog-to-digital converter employing multi-stage noise shaping (MASH) and dual digital error correction.

FIG. 2 is a block diagram of a known analog-to-digital converter (ADC) employing multi-stage noise shaping (MASH) and dual digital error correction. The circuit 200 of FIG. 2 is described at Zhang et al., "A 14-bit dual-path 2-0 MASH ADC with dual digital error correction," Analog Integr. Circ. Sig. Process. (2009) vol. 59, p. 143-150 and at Zhang, Z., "A Dual-Path 2-0 MASH ADC with Dual Digital Error Correction," doctoral dissertation (thesis) at Oregon State University, 2006, both of which are hereby incorporated by reference herein in their entireties. Circuit 200 converts an analog input signal U to a digital output signal Vsum using circuits 205$a$ and 205$b$. Circuit 200 is a cascaded two-stage sigma-delta ADC in a configuration known as a multi-stage noise shaping (MASH) configuration. Circuit 205$a$ includes a sigma-delta modulator (SDM) having a first stage in a feed-forward configuration as in FIG. 1, i.e., with a second-order loop filter 212$a$, an adder 214$a$, a 9-level ADC 216$a$, and a 9-level DAC 218$a$ that provides feedback to a subtractor 210$a$. A second stage of the SDM includes a 10-bit pipeline ADC 221$a$ for quantization of an error of the SDM provided by the loop filter 212$a$. A DAC error correction module 219$a$ determines an error associated with the DAC 218$a$ and provides an error correction term to adder 222$a$, which may be a subtractor. A MASH mismatch correction module 228$a$ and a finite impulse response (FIR) filter 230$a$ update the output Vsum via an adder 220a. Details of the DAC error correction module 219a, MASH mismatch correction module 228a, and FIR filter 230a are presented in the paper and dissertation by Zhang.

Circuit 205a provides a digital output signal V1 at the output of adder 222a. Circuit 205b includes similar components as circuit 205a, denoted in FIG. 2 with a suffix 'b' instead of 'a' as in circuit 205a. Thus, circuit 205b provides a digital output signal V2, and circuits 205a and 205b are parallel processing pathways. Signals V1 and V2 are added at adder 224 to provide the output signal Vsum, and a difference between V1 and V2 is computed at subtractor 226 to provide a difference signal Vdif. A pseudorandom test signal (not shown) TEST is injected (added) to each of ADC 216a and ADC 216b. The test signal TEST has the same signal paths (in circuits 205a and 205b) as quantization noise Q associated with ADCs 216a and 216b. Test signal TEST is uncorrelated with the input signal U and with conversion error signals (e.g., quantization noise, DAC errors, and device noise terms). The difference signal Vdif does not have a contribution from the input signal U, because that contribution has been removed. Thus, circuit 200 comprises two independently processed signals V1 and V2 that are subtracted from each other to estimate a remainder as being an error that the FIR filter 230a is adjusted to seek to minimize. In other words, circuit 200 cancels the input signal U using two sets of sigma-delta modulation in order to speed up the convergence of calibration.

Figure 3A:
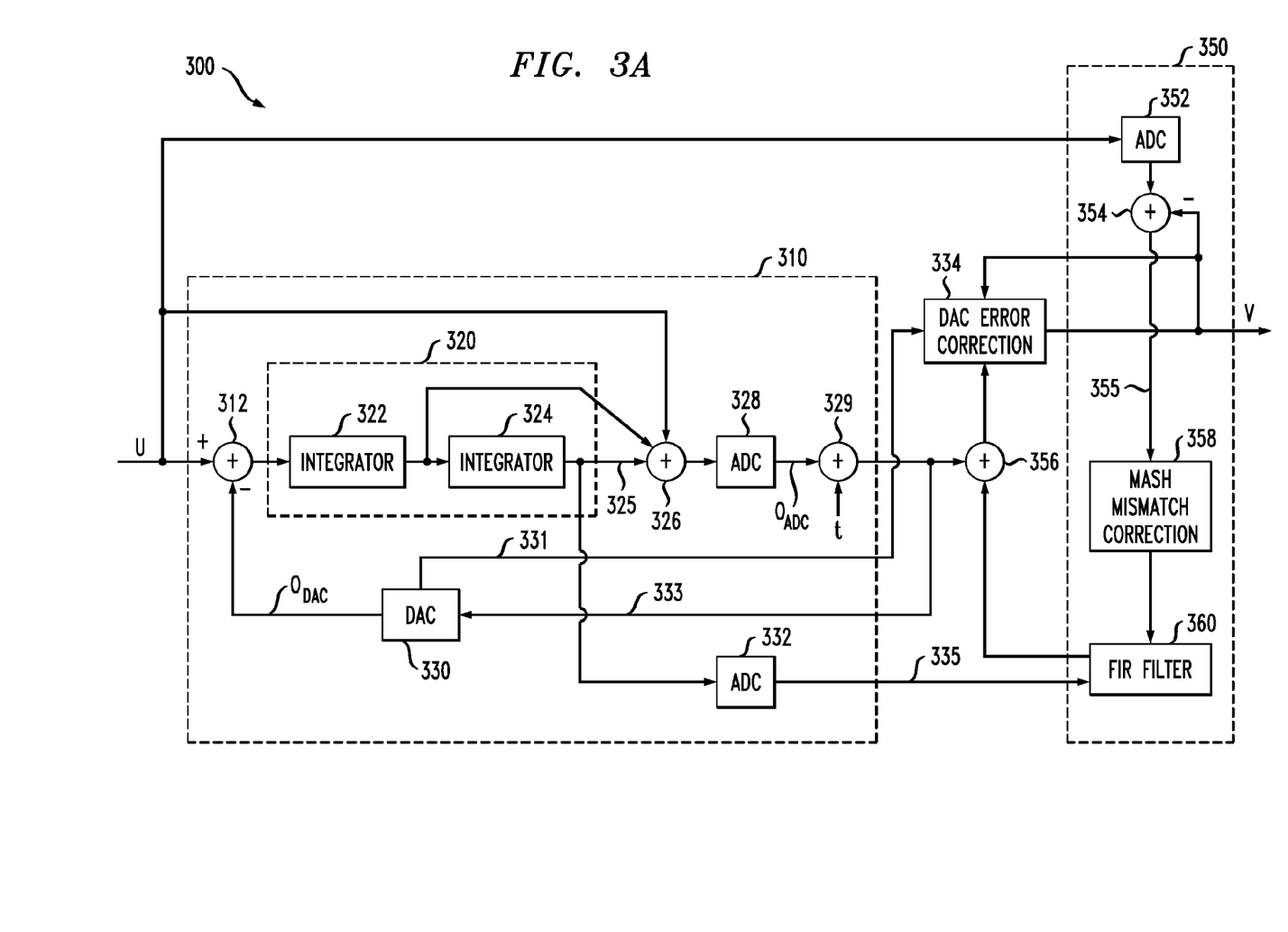
FIG. 3A is a block diagram of a MASH ADC in accordance with an exemplary embodiment.

FIG. 3A is a block diagram of a MASH ADC in accordance with an exemplary embodiment. An analog input signal U is processed by a sigma-delta modulator 310, which may be a two-stage SDM, and by a calibration circuit 350, to provide a digital output signal V. The SDM 310 may have a first stage that includes a subtractor 312, a loop filter 320, an adder 326, an ADC 328 having output $O_{ADC}$, and a DAC 330 having output $O_{DAC}$ in a feed-forward configuration. The loop filter 320 may be a second order loop filter having integrators 322 and 324, which may be switched capacitor integrators known to one of ordinary skill in the art. A pseudorandom test signal t is added (injected) to ADC 328. The pseudorandom test signal t may be added to the input or the output of ADC 328 in various embodiments. In the exemplary embodiment shown in FIG. 3A, The pseudorandom test signal t is added to the output of ADC 328 $O_{ADC}$ via adder 329 to provide a first digital signal 333. In this case, t may a pseudorandom sequence drawn from {−1, 1}, i.e., may take on values of −1 or 1. In another embodiment (not shown), t may be added to the input of the ADC using an adder, in which case t may be a pseudorandom signal with possible analog values between −x and x, where x is a predetermined real number.

A known DAC error correction module 334, described below in the context of FIG. 3B, compensates the output of ADC 328 to account for an error associated with DAC 330 and provide a digital output signal V that represents analog input signal U in digital format. Digital output signal V is calibrated (ADC 300 is calibrated) by calibration circuit 350.

SDM 320 may have a second stage comprising an ADC 332, which may be a multi-bit (e.g., 10-bit) pipeline ADC, that is configured to receive an output 325 of loop filter 320 and provide a second digital signal 335 to calibration circuit 350. Specifically, the second digital signal 335 is provided to a finite impulse response (FIR) filter 360, which may be a second order FIR filter. An output of the FIR filter 360 is referred to as a calibration filter signal. The FIR filter 360 is adjusted to seek to minimize an error 355 that is computed at subtractor 354 as a difference between digital output signal V and a quantization of input signal U obtained at an ADC 352. ADC 352, like ADC 328, may be a 9-level ADC known in the art.

An output of subtractor 354 is provided to MASH mismatch correction module 358, which may be implemented according to known techniques as in the Zhang paper and thesis. For example, the MASH mismatch correction module 358 may be implemented as shown in FIG. 3D. The output 355 of subtractor 354 is combined with the pseudorandom test signal t at multiplier 376, with the output accumulated at an accumulator 378. Accumulator 378 is an ordinary accumulator known in the art to one of ordinary skill. An output from MASH mismatch correction module 358 is provided to FIR filter 360.

Circuit 300 does not require two SDM pathways, as does circuit 200. Rather, circuit 300 processes analog input signal U via SDM circuit 310 and in parallel processes the input signal with an ADC 352. Thus, only a modest amount of analog processing occurs in a secondary pathway, as opposed to a full secondary SDM. As a result, circuit 300 occupies less silicon area than circuit 200.

The operation of circuit 300 may be understood as follows. The feedback control signal provided to FIR filter 360 is correlated to an error signal associated with an output of subtractor 354 and not to the input signal U. The input signal U is removed from the control the FIR filter 360 by converting the input signal U to digital at ADC 352 and subtracting it from the digital output signal V (or vice versa) at subtractor 354. The FIR filter converges on the leakage error of the ADC circuit 300 quickly, without the need for a duplicate SDM circuit as in the prior art.

A z-transform of digital output signal V can be characterized as $V(z)=U(z)+(t+Q_1(z))/(1+H_1(z)+H_1(z)H_2(z))$. As so characterized, $U(z)$ corresponds to the analog input signal U; $Q_1(z)$ corresponds to a z-transform representation of ADC 328; and $H_1(z)$ and $H_2(z)$ correspond to outputs of integrators 322 and 324, respectively. The derivation of this z-transform representation $V(z)$ is as follows. Let $X_1$, $X_2$, and $X_3$ be the outputs of integrator 322, integrator 324, and adder 326, respectively, so that $X_1=(U-V)*H_{11}$, $X_2=X_1*H_{12}$, and $X_3=U+X_1+X_2$, where the variable z is omitted from the notation for convenience. Considering these three equations together with the equation $V=Q_1+X_3$ provides a system of four equations in four unknowns. Solving for V yields $V=U+Q_1/(1+H_{11}+H_{11}H_{12})$. Finally, injecting the pseudorandom test signal t yields the z-transform representation $V(z)$ specified above.

A z-transform of the output of subtractor 354 can be characterized as $V_c(z)=(t+Q_1(z))/(1+H_1(z)+H_1(z)H_2(z))-Q_2(z)$. As so characterized, $Q_2(z)$ corresponds to a z-transform representation of ADC 352. This z-transform representation $V_c(z)$ is derived by observing that $V_c=V-(U+Q_2)$ with the notational framework provided above.

Figure 3B:
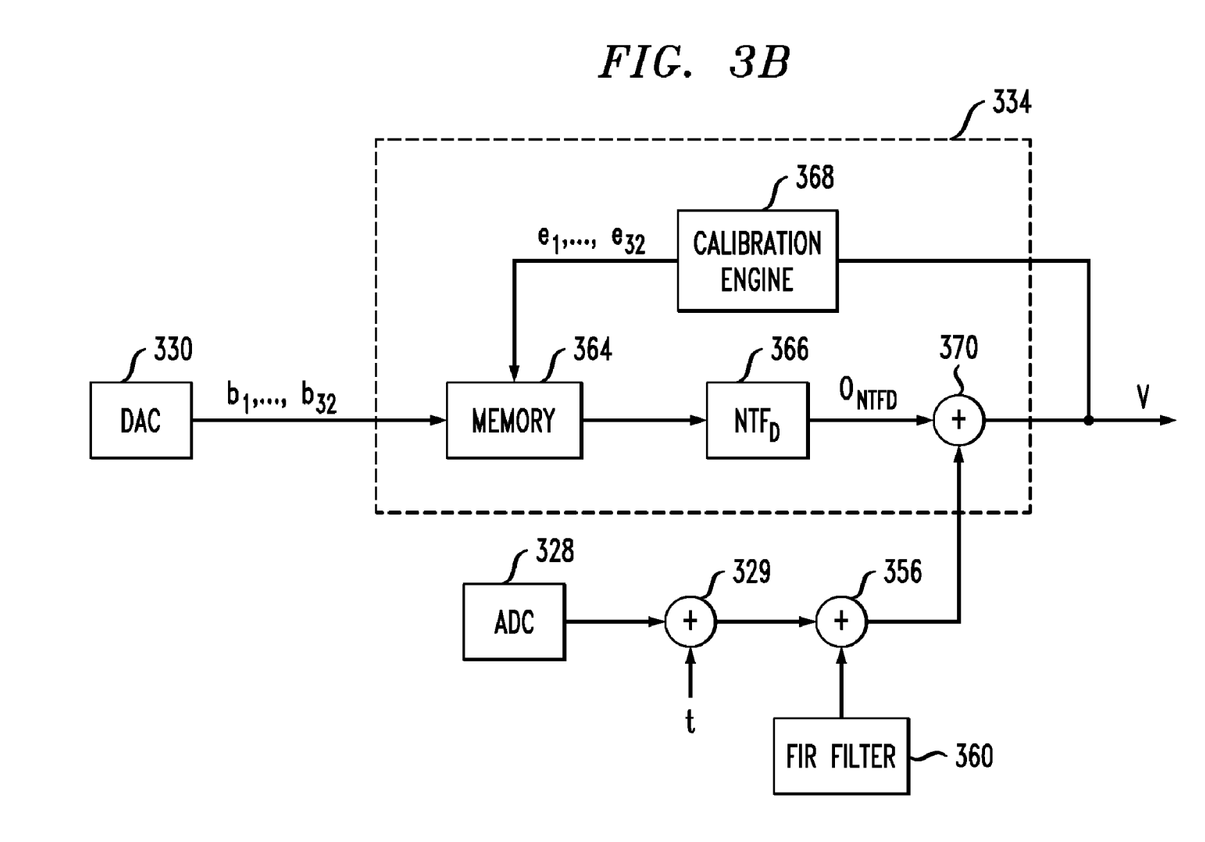
FIG. 3B is a block diagram of a digital to analog converter (DAC) error correction module in accordance with an exemplary embodiment.

FIG. 3B is a block diagram of DAC error correction module 334. DAC 330 provides thermometer codes $b_1, \ldots, b_{32}$ to a memory 364, which may be a random access memory. Thermometer codes are known in the art and are used for unary computation of analog output values in digital to analog converters. Thermometer codes $b_1, \ldots, b_{32}$ are stored for use in error calculation and compensation/calibration. A calibration engine 368 provides the estimated errors for elements of DAC 330. Since DAC 330 in the embodiment of FIG. 3B includes 32 elements, DAC calibration engine 368 provides 32 estimated errors $e_1, \ldots, e_{32}$ to be stored in memory 364. In an embodiment the total estimated error for DAC 330 includes $b_1*e_1+ \ldots +b_{32}*e_{32}$ wherein $e_1, \ldots, e_{32}$ represent the estimated errors and $b_1, \ldots, b_{32}$ represent the thermometer codes for respective DAC elements $D_1$ to $D_{32}$ (shown in FIG. 3C) of the 5-bit DAC 330. In various embodiments, the DAC 330 may be other than a 5-bit DAC, with the thermometer codes and estimated errors varied accordingly.

Figure 3C:
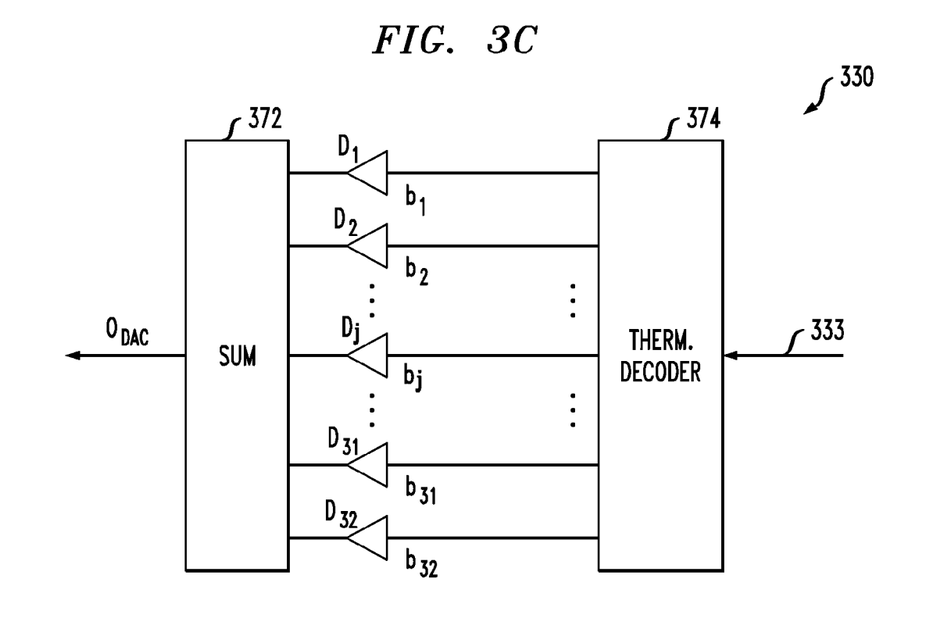
FIG. 3C is a block diagram of a DAC in accordance with an exemplary embodiment.
Figure 3D:
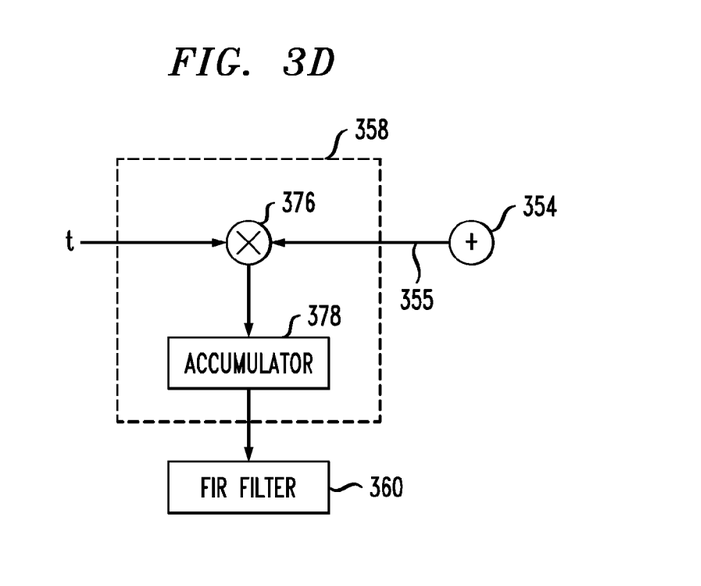
FIG. 3D is a block diagram of a multi-stage noise shaping (MASH) mismatch correction module in accordance with an exemplary embodiment.

In DAC error correction module 334, an extra DAC element (e.g., element $D_{32}$ in FIG. 4C) is provided to function in place of a DAC element under calibration. Depending on applications this extra DAC element may be switched in and out of DAC 330 for calibration or normal operation by switches and/or transistors. Various embodiments inject at least one pseudorandom test signal t having a pseudorandom sequence of −1 and +1 to the DAC element under calibration, acquire the accumulated errors of the DAC element(s) under calibration, and save them to memory 364. Various embodiments then use the accumulated and estimated errors to compensate for output V, taking account of other factors such as noise effect of the loop comprising DAC 330, loop filter 320, and ADC 328, etc.

Memory 364 stores error estimates for calibration. Depending on applications, various embodiments calibrate each element in DAC 330, and the more elements DAC 330 includes, the more data is provided by calibration engine 368 and the more data is stored in memory 364. The estimated and accumulated errors in memory 364 are later used to calibrate DAC 330. In an embodiment, memory 364 stores the total calibration value represented by $e_1 * b_1 + \ldots + e_{32} * b_{32}$.

$NTF_D$ 366 (which stands for "noise transfer function digital") serves as a transfer function from output $O_{DAC}$ of DAC 330 to output $O_{ADC}$ of ADC 328. Transfer function $NTF_D$ 366 takes account of the effect of signal $O_{DAC}$ passing through loop filter 320 and ADC 328 and provides appropriate compensation. For example, if $NTF_D = z^{-2}$ implemented as a delay unit followed by another delay unit, then the estimated error at signal $O_{DAC}$, which includes $e_1 * b_1 + \ldots + e_{32} * b_{32}$ and passes through loop filter 320 and ADC 328, is delayed by two delay units. As another example, if the transfer function is 2× (i.e., $NTF_D = 2$), and if the signal $O_{DAC}$ is $e_1 * b_1 + \ldots + e_{32} * b_{32}$, then the output $O_{NTFD}$ is $2 * (e_1 * b_1 + \ldots + e_{32} * b_{32})$. Other effects transferred by transfer function $NTF_D$ 366 are within the scope of embodiments of the disclosure.

FIG. 3C is a block diagram of a DAC (e.g., DAC 330) in accordance with an exemplary embodiment. Generally, an M-bit DAC uses $2^M - 1$ DAC elements D for normal operation. DAC elements D convert the digital signal to analog. In the example of M-bit DAC 330, $2^M - 1$ DAC elements D provide $2^M$ levels from 0 to $2^M - 1$, each of which corresponds to an analog value. As a result, the $2^M$ levels provided by $2^M - 1$ DAC elements D correspond to analog values in the analog range to be converted (e.g., from −1V to 1V; various ranges may be used). An extra DAC element (e.g., DAC element $D_{32}$ when M=5) allows for calibration of DAC elements D. For illustrative purposes FIG. 3C shows a 5-bit DAC 330 using 31 ($2^5 - 1$) DAC elements D with an extra DAC element $D_{32}$ for a total of 32 DAC elements.

Thermometer decoder 374 decodes the digital signal 333, which has a pseudorandom test signal t injected therein, into 32 thermometer codes $b_1, \ldots, b_{32}$ (generally b), each corresponding to a DAC element D. Those skilled in the art will recognize that a thermometer code b includes a 0 or 1 value depending on the signal to be decoded. For example, in a 5-bit ADC, there are 32 values of b for $b_0, \ldots, b_{31}$, and if signal 333 has a value of 4 then $b_0$ through $b_3$ are 1, and the rest of the thermometer codes $b_4$ through $b_{31}$ are 0. DAC 330 includes a summing block 372 as is known in the art.

Figure 4:
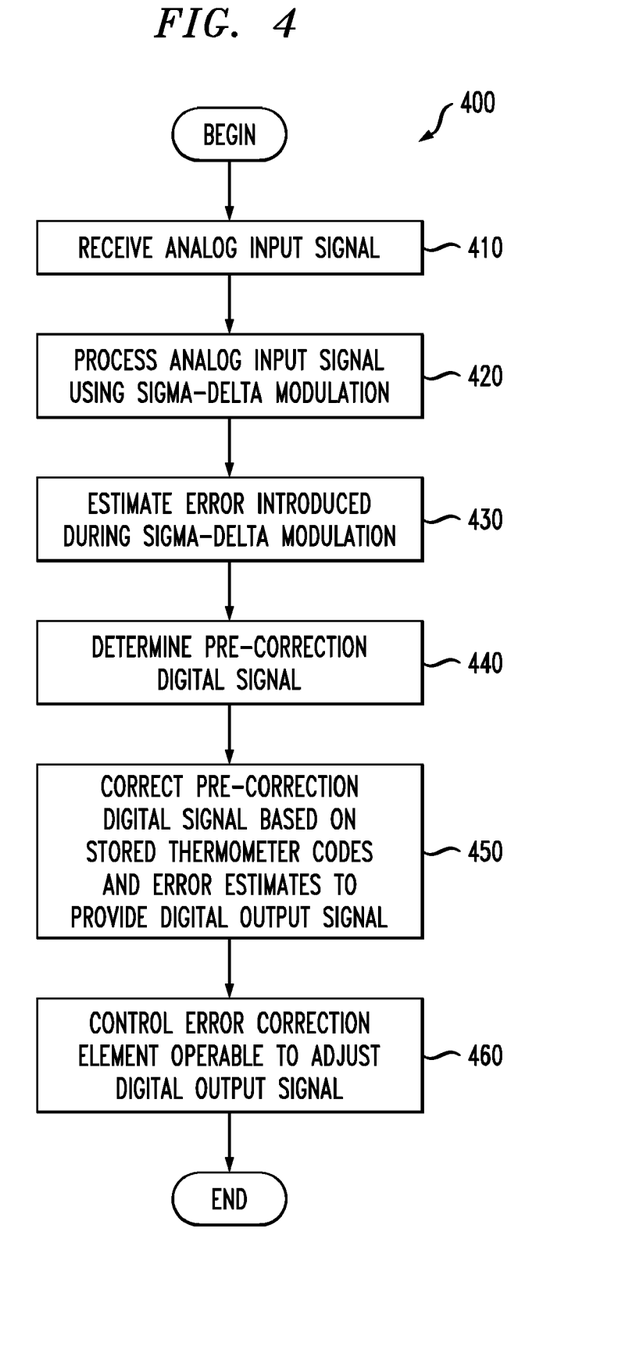
FIG. 4 is a flow diagram in accordance with an exemplary embodiment.

FIG. 4 is a flow diagram in accordance with an exemplary embodiment. After process 500 begins, an analog input signal is received (step 510). The analog input signal is processed (520) using sigma-delta modulation to provide a first digital signal that represents the analog input signal in digital format and to provide a second digital signal that represents a first error introduced during the sigma-delta modulation. A second error that is error introduced during the sigma-delta modulation is estimated (530). A pre-correction signal is determined (540) based on the first and second digital signals. A difference between the estimated second error and the pre-correction digital signal is determined (550) to provide a digital output signal representing the analog input signal in digital format. An error correction element operable to adjust the digital output signal based on the analog input signal, the digital output signal, and the second digital signal is controlled (560).

The above illustrations provide many different embodiments for implementing different features. Specific embodiments of components and processes are described to help clarify the invention. These are, of course, merely embodiments and are not intended to serve as limitations beyond those described in the claims.

Although embodiments are illustrated and described herein in one or more specific examples, embodiments are nevertheless not intended to be limited to the details shown, since various modifications and structural changes may be made therein without departing from the spirit of the embodiments and within the scope and range of equivalents of the claims.

What is claimed is:

1. A multi-stage noise-shaping (MASH) analog to digital converter (ADC) comprising:
    a sigma-delta modulator (SDM) circuit configured to:
        convert an analog input signal to a first digital signal representing the analog input signal in digital format; and
        provide a second digital signal representing a first error of the SDM circuit;
    an error correction module configured to:
        estimate a second error introduced by the SDM circuit based on the first digital signal, and
        provide a digital output signal representing the analog input signal in digital format; and
    a calibration circuit configured to update the digital output signal based on the analog input signal, the digital output signal, and the second digital signal.

2. The MASH ADC of claim 1 wherein the SDM circuit comprises:
    a first stage configured in a feed forward SDM configuration to convert the analog input signal to the first digital signal; and
    a second stage configured to convert an SDM filter signal representing the first error to the second digital signal.

3. The MASH ADC of claim 2 wherein the error correction module comprises a first adder configured to provide the digital output signal based on the estimate of the second error, and wherein the first stage of the SDM circuit comprises:
    an SDM filter configured to filter an SDM pre-filter signal to provide the SDM filter signal;
    a second adder configured to add the SDM filtered signal to the analog input signal;
    a first ADC configured to quantize an output of the second adder; and
    a third adder configured to add a pseudorandom signal to the output of the first ADC to provide the first digital signal in the first stage;
    a digital to analog converter (DAC) configured to convert the first digital signal to an analog output signal; and a first subtractor configured to determine a difference between the analog output signal and the analog input signal to provide the SDM pre-filter signal.

4. The MASH ADC of claim 3 wherein the SDM filter is a second order loop filter.

5. The MASH ADC of claim 3 wherein the calibration circuit comprises:
- a second ADC configured to quantize the analog input signal;
- a second subtractor configured to compute a difference between the digital output signal and the quantized analog input signal to provide a mismatched signal;
- a MASH mismatch correction module configured to accumulate a product of the pseudorandom signal and the output of the second subtractor; and
- a calibration filter configured to:
  - receive the second digital signal and an output of the MASH mismatch correction module, and
  - provide a calibration filter signal.

6. The MASH ADC of claim 5 wherein the calibration filter is a second order finite impulse response (FIR) filter.

7. The MASH ADC of claim 5 wherein a z-transform of the digital output signal can be characterized as $V(z)=U(z)+(t+Q_1(z))/(1+H_1(z)+H_1(z)H_2(z))$, and as so characterized, $U(z)$ corresponds to the analog input signal, t corresponds to the pseudorandom signal, $Q_1(z)$ corresponds to a z-transform representation of the first ADC, the SDM filter is a second order loop filter having first and second integrators, and $H_1(z)$ and $H_2(z)$ correspond to outputs of the first and second integrators, respectively.

8. The MASH ADC of claim 5 wherein a z-transform of the mismatched signal can be characterized as $V_c(z)=(t+Q_1(z))/(1+H_1(z)+H_1(z)H_2(z))+Q_2(z)$, and as so characterized, t corresponds to pseudorandom signal, $Q_1(z)$ and $Q_2(z)$ correspond to z-transform representations of the first and second ADCs, respectively, the SDM filter is a second order loop filter having first and second integrators, and $H_1(z)$ and $H_2(z)$ correspond to outputs of the first and second integrators, respectively.

9. The MASH ADC of claim 3 wherein the estimate of the second error is a digital estimate of an error of the DAC.

10. The MASH ADC of claim 3 wherein the second stage of the SDM circuit comprises a third ADC that is a multi-bit pipeline ADC configured to convert the SDM filtered signal to the second digital signal.

11. A method of converting an analog signal to digital format, the method comprising:
- receiving an analog input signal;
- processing the analog input signal using sigma-delta modulation (SDM) to provide a first digital signal that represents the analog input signal in digital format and to provide a second digital signal that represents a first error introduced during the sigma-delta modulation;
- estimating a second error introduced during the sigma-delta modulation;
- determining a pre-correction digital signal based on the first and second digital signals;
- correcting the pre-correction digital signal based on stored thermometer codes and error estimates to provide a digital output signal representing the analog input signal in digital format; and
- controlling an error correction element operable to adjust the digital output signal based on the analog input signal, the digital output signal, and the second digital signal.

12. The method of claim 11, wherein processing the analog input signal using sigma-delta modulation includes:
- processing the analog input signal in a first stage of the sigma-delta modulation by:
  - filtering a pre-filter SDM feed-forward error signal to provide an SDM filter signal,
  - adding the SDM filter signal to the analog input signal to provide a pre-quantizer signal,
  - quantizing the pre-quantizer signal to provide a quantized signal,
  - adding a pseudorandom signal to the quantized signal to provide the first digital signal,
  - converting the first digital signal to an analog output signal, and
  - determining a difference between the analog output signal and the analog input signal to provide the pre-filter SDM feed-forward error signal; and
- quantizing the SDM filter signal in a second stage of the sigma-delta modulation to provide the second digital error signal.

13. The method of claim 12 wherein filtering the pre-filter SDM feed-forward error signal comprises:
- integrating the pre-filter SDM feed-forward error signal with a first integrator of a second order loop filter to provide an intermediate integration signal; and
- integrating the intermediate integration signal with a second integrator of the second order loop filter to provide the SDM filter signal.

14. The method of claim 12 wherein adjusting the digital output signal comprises:
- quantizing the analog input signal;
- determining a difference between the digital output signal and the quantized analog input signal to provide a mismatched signal;
- accumulating a product of the pseudorandom signal and the mismatched signal to provide a calibration pre-filter signal; and
- filtering the second digital signal and the calibration pre-filter signal to provide a calibration filter signal; and
- wherein determining the pre-correction digital signal comprises adding the first digital signal and the calibration filter signal.

15. The method of claim 14, wherein a z-transform of the digital output signal can be characterized as $V(z)=U(z)+(t+Q_1(z))/(1+H_1(z)+H_1(z)H_2(z))$, and as so characterized, $U(z)$ corresponds to the analog input signal, t corresponds to the pseudorandom signal, $Q_1(z)$ corresponds to a z-transform representation of the first digital signal, filtering the pre-filter SDM feed-forward error signal corresponds to integrating the pre-filter SDM feed-forward error signal with a first integrator and a second integrator, and $H_1(z)$ and $H_2(z)$ correspond to outputs of the first and second integrators, respectively.

16. The method of claim 14, wherein a z-transform of the mismatched signal can be characterized as $V_c(z)=(t+Q_1(z))/(1+H_1(z)+H_1(z)H_2(z))-Q_2(z)$, and as so characterized, t corresponds to the pseudorandom signal, $Q_1(z)$ corresponds to the first digital signal, $Q_2(z)$ corresponds to the quantized analog input signal, filtering the pre-filter SDM feed-forward error signal corresponds to integrating the pre-filter SDM feed-forward error signal with a first integrator and a second integrator, and $H_1(z)$ and $H_2(z)$ correspond to outputs of the first and second integrators, respectively.

17. A calibration circuit comprising:
- an analog to digital converter (ADC) configured to quantize an analog input signal;
- a subtractor configured to compute a difference between the quantized analog input signal and a digital output signal representing the analog input signal in digital format;

a correction module configured to correct an output of the subtractor; and a filter configured to:
  receive an output of the correction module and an error of a sigma-delta modulator, and
  provide a calibration signal operable to adjust the digital output signal.

18. The calibration circuit of claim 17 wherein the correction module comprises:

a multiplier configured to multiply a pseudorandom signal and an output of the subtractor; and an accumulator configured to accumulate an output of the multiplier.

19. The calibration circuit of claim 17 wherein the filter is a second-order finite impulse response filter.

20. The calibration circuit of claim 17 wherein the pseudorandom signal has a value of −1 or 1 as determined pseudorandomly.

* * * * *